(12) United States Patent
Tang et al.

(10) Patent No.: US 11,145,704 B2
(45) Date of Patent: Oct. 12, 2021

(54) ORGANIC LIGHT EMITTING DIODE DISPLAY AND METHOD OF MANUFACTURING THEREOF

(71) Applicant: SHENZHEN CHINA STAR OPTOELECTRONICS SEMICONDUCTOR DISPLAY TECHNOLOGY CO., LTD., Guangdong (CN)

(72) Inventors: Jia Tang, Guangdong (CN); Jangsoon Im, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 362 days.

(21) Appl. No.: 16/337,392

(22) PCT Filed: Mar. 14, 2019

(86) PCT No.: PCT/CN2019/078188
§ 371 (c)(1),
(2) Date: Mar. 27, 2019

(87) PCT Pub. No.: WO2020/147186
PCT Pub. Date: Jul. 23, 2020

(65) Prior Publication Data
US 2021/0233985 A1    Jul. 29, 2021

(30) Foreign Application Priority Data

Jan. 14, 2019  (CN) .................. 201910032553.8

(51) Int. Cl.
*H01L 27/32*     (2006.01)
*H01L 51/56*     (2006.01)
*H01L 27/12*     (2006.01)

(52) U.S. Cl.
CPC ........ *H01L 27/3265* (2013.01); *H01L 27/322* (2013.01); *H01L 27/3262* (2013.01);
(Continued)

(58) Field of Classification Search
CPC .............. H01L 27/3265; H01L 27/322; H01L 27/3262; H01L 27/3272; H01L 51/56;
(Continued)

(56) References Cited

U.S. PATENT DOCUMENTS

2016/0163780 A1  6/2016  Park
2018/0069069 A1  3/2018  Ebisuno et al.
2019/0206971 A1  7/2019  Kim et al.

FOREIGN PATENT DOCUMENTS

CN    105679792 A    6/2016
CN    109979970 A    7/2019

*Primary Examiner* — Dzung Tran
(74) *Attorney, Agent, or Firm* — Hamre, Schumann, Mueller & Larson, P.C.

(57) ABSTRACT

An organic light emitting diode (OLED) display panel and a method of manufacturing thereof. The display panel including: a baseplate comprising a color film layer; a first transparent conductive layer including a first region corresponding to the color film layer and a second region corresponding to a region for forming a gate lamination layer; an active region including a first active region and a second active region, the first active region is disposed above the first region, and the second active region is disposed above the second region; a gate lamination layer, an interlayer dielectric layer, a second transparent conductive layer, a planarization layer, an anode and a pixel defining layer disposed on the second active region.

11 Claims, 3 Drawing Sheets

(52) U.S. Cl.
CPC .......... *H01L 27/3272* (2013.01); *H01L 51/56*
(2013.01); *H01L 27/1214* (2013.01); *H01L 27/3248* (2013.01); *H01L 2227/323* (2013.01)

(58) Field of Classification Search
CPC ............. H01L 27/1214; H01L 27/3248; H01L 2227/323
USPC ......................................................... 257/40
See application file for complete search history.

ORGANIC LIGHT EMITTING DIODE DISPLAY AND METHOD OF MANUFACTURING THEREOF

CROSS REFERENCE TO RELATED APPLICATION

This application claims the priority of International Application No. PCT/CN2019/078188, filed on Mar. 14, 2019, which claims priority to Chinese Application No. 201910032553.8, filed on Jan. 14, 2019. The entire disclosures of each of the above applications are incorporated herein by reference.

BACKGROUND OF APPLICATION

Field of Application

The present application relates to the field of display technologies, and in particular, to an organic light emitting diode (OLED) display and a method for manufacturing thereof.

Description of Prior Art

With the development of display technology, organic light emitting diode (OLED) displays have made significant progresses. OLED products have attracted more and more attention and application due to their advantages, such as being light in weight, fast response times, wide viewing angles, high contrast, and flexibility. OLED products are mainly used in mobile phones, tablets, TVs, and other display technology fields.

Technical Problem

As panels increase in size, resistance of signal lines becomes non-negligible, resulting in an increase in a voltage drop phenomenon which leads to uneven brightness of the display panels and restricting the mass production of large-sized OLED display panels. Therefore, there is an urgent need to solve this problem.

SUMMARY OF APPLICATION

The application provides an organic light emitting diode (OLED) display panel and a manufacturing method thereof to increase the capacitance of the OLED panel.

To solve the above problems, the present application provides an OLED display panel including:
a baseplate including a color film layer;
a first transparent conductive layer disposed on the baseplate, the first transparent conductive layer including a first region corresponding to the color film layer and a second region corresponding to a region for forming a gate lamination layer;
a buffer layer covering the first transparent conductive layer;
an active region disposed on the buffer layer, wherein the active region includes a first active region and a second active region, the first active region is disposed above the first region, and the second active region is disposed above the second region;
the gate lamination layer disposed on the second active region;
an interlayer dielectric layer covering the second buffer layer, the active region, and the gate lamination layer, the interlayer dielectric layer having a plurality of via holes;
a second transparent conductive layer disposed on the interlayer dielectric layer, wherein the second transparent conductive layer covers the active region, and realizes electrical connection of source and drain regions through the via holes;
a planarization layer covering the interlayer dielectric layer and the second transparent conductive layer;
an anode disposed on the planarization layer;
a pixel defining layer exposing the anode;
a light emitting structure covering the pixel defining layer and the anode;
wherein
a projection of the color film layer disposed on the horizontal plane, a projection of the first region on the horizontal plane, and a projection of the first active region on the horizontal plane are overlapped.

According to one aspect of the application, the baseplate includes:
a substrate;
a patterned color film layer disposed on the substrate;
a first buffer layer covering the substrate and the color film layer.

According to one aspect of the application, the display panel further includes a light shielding metal layer between the first transparent conductive layer and the buffer layer, a projection of the light shielding metal layer on the horizontal plane overlaps with a projection of the second active region on the horizontal plane.

According to one aspect of the application, the display panel further includes a metal layer disposed on the second transparent conductive layer, a projection of the metal layer on the horizontal plane overlaps with a projection of the second active region on the horizontal plane.

According to one aspect of the application, material of the metal layer is a light shielding metal.

The present application provides an OLED display panel including:
a baseplate including a color film layer;
a first transparent conductive layer disposed on the baseplate, the first transparent conductive layer including a first region corresponding to the color film layer and a second region corresponding to a region for forming a gate lamination layer;
a buffer layer covering the first transparent conductive layer;
an active region disposed on the buffer layer, wherein the active region includes a first active region and a second active region, the first active region is disposed above the first region, and the second active region is disposed above the second region;
the gate lamination layer disposed on the second active region;
an interlayer dielectric layer covering the second buffer layer, the active region, and the gate lamination layer, the interlayer dielectric layer having a plurality of via holes;
a second transparent conductive layer disposed on the interlayer dielectric layer, wherein the second transparent conductive layer covers the active region, and realizes electrical connection of source and drain regions through the via holes;
a planarization layer covering the interlayer dielectric layer and the second transparent conductive layer;
an anode disposed on the planarization layer;
a pixel defining layer exposing the anode;

a light emitting structure covering the pixel defining layer and the anode.

According to one aspect of the application, a projection of the color film layer on the horizontal plane, a projection of the first region on the horizontal plane, and a projection of the first active region on the horizontal plane are overlapped.

According to one aspect of the application, the baseplate includes:

a substrate;

a patterned color film layer disposed on the substrate;

a first buffer layer covering the substrate and the color film layer.

According to one aspect of the application, the display panel further includes a light shielding metal layer between the first transparent conductive layer and the buffer layer, a projection of the light shielding metal layer on the horizontal plane overlaps with a projection of the second active region on the horizontal plane.

According to one aspect of the application, the display panel further includes a metal layer disposed on the second transparent conductive layer, a projection of the metal layer on the horizontal plane overlaps with a projection of the second active region on the horizontal plane.

According to one aspect of the application, material of the metal layer is a light shielding metal.

The present application further provides a method of manufacturing an OLED display panel, including the steps of:

providing a baseplate including a color film layer;

forming a first transparent conductive layer disposed on the baseplate, wherein the first transparent conductive layer includes a first region and a second region, the first region covers the color film layer, and the second region is used to form a gate lamination layer;

forming a buffer layer covering the first transparent conductive layer;

forming an active region disposed on the buffer layer, wherein the active region includes a first active region and a second active region, the first active region is disposed above the first region, and the second active region is disposed above the second region;

forming the gate lamination layer over the second active region;

forming an interlayer dielectric layer covering the second buffer layer, the first active region, and the gate lamination layer, the interlayer dielectric layer having a plurality of via holes;

forming a second transparent conductive layer disposed on the interlayer dielectric layer, wherein the second transparent conductive layer is disposed above the first region and the second region, and realizes electrical connection of source and drain regions through the via holes;

forming a planarization layer covering the interlayer dielectric layer and the second transparent conductive layer;

forming an anode disposed on the planarization layer;

forming a pixel defining layer exposing the anode;

forming a light emitting structure covering the pixel defining layer and the anode.

According to one aspect of the application, a projection of the color film layer on the horizontal plane, a projection of the first region on the horizontal plane, and a projection of the first active region on the horizontal plane are overlapped.

According to one aspect of the application, after forming the first transparent conductive layer, the method further includes the steps of:

forming a light shielding metal layer covering the first transparent conductive layer;

patterning the light shielding metal layer to make its projection on the horizontal plane overlaps with a projection of the second active region on the horizontal plane.

According to one aspect of the application, the method of patterning the light shielding metal layer and the first transparent conductive layer includes:

providing a mask having a first pattern for forming a first transparent conductive layer and a second pattern for forming the light shielding metal layer;

forming a photoresist covering the light shielding metal layer and the first transparent conductive layer, the photoresist having a first thickness;

the photoresist is patterned by the mask to form a first photoresist over the first transparent conductive layer and a second photoresist over the light shielding metal layer, the thickness of the first photoresist is less than the thickness of the second photoresist;

the light shielding metal layer and the first transparent conductive layer are patterned by using the first photoresist and the second photoresist as a mask.

According to one aspect of the application, the first pattern and the second pattern of the mask have different transmittances, and the transmittance of the first pattern is smaller than the transmittance of the second pattern.

According to one aspect of the application, after forming the second transparent conductive layer, the method further includes the steps of:

forming a metal layer over the second transparent conductive layer, a projection of the metal layer on the horizontal plane overlaps with a projection of the second active region on the horizontal plane.

According to one aspect of the application, material of the metal layer is a light shielding metal.

Beneficial Effect

The OLED display panel provided by the present application has a first transparent conductive layer disposed on the baseplate, a first active region disposed on the first transparent conductive layer, and a second transparent conductive layer disposed on the first active region. The first transparent conductive layer, the first active region and the second transparent conductive layer are respectively separated by a buffer layer and an interlayer dielectric layer, thereby forming a three-layer parallel capacitor structure. The present application can effectively increase the capacitance of the display panel and eliminate the pressure drop phenomenon.

BRIEF DESCRIPTION OF DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF PREFERRED EMBODIMENTS

Figure 1:
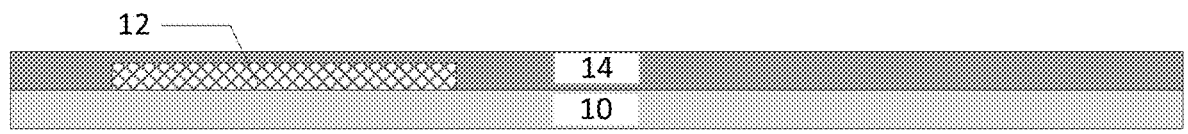
FIG. 1 to FIG. 10 are schematic structural diagrams of an organic light emitting diode (OLED) display panel in different process steps in an embodiment of the present application.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The application provides an organic light emitting diode (OLED) display panel and a manufacturing method thereof to increase the capacitance of the OLED panel. The application will be described in detail below with reference to the accompanying drawings. Specifically, referring to FIG. 1 to FIG. 10, FIG. 1 to FIG. 10 are schematic structural diagrams of an OLED display panel in different process steps in an embodiment of the present application.

Figure 10:
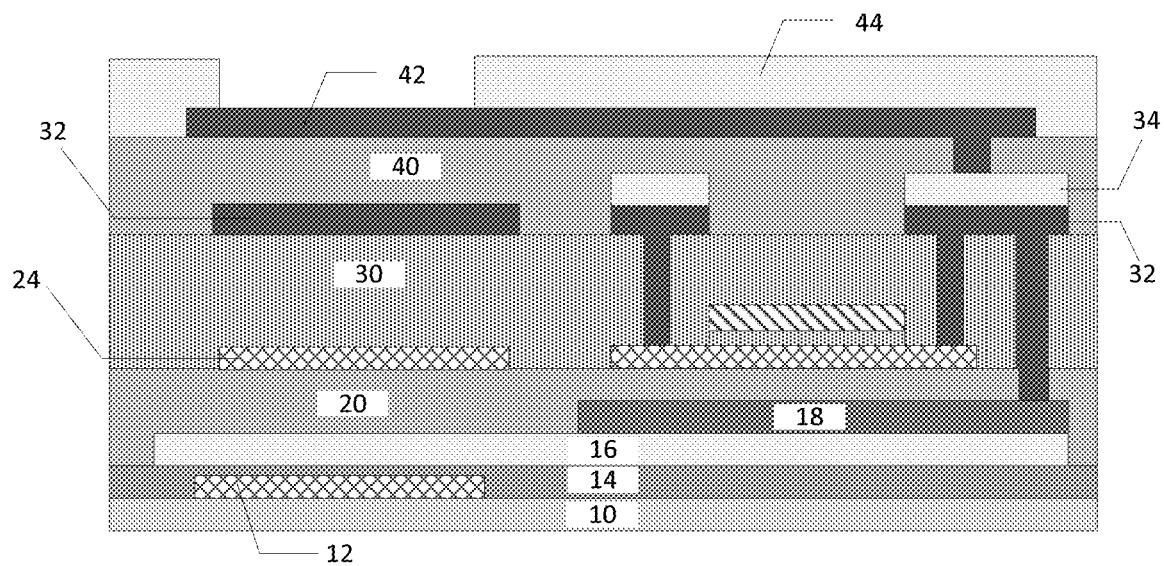

As shown in FIG. 10, the present application provides an organic light emitting diode (OLED) display panel including:

a baseplate including a color film layer 12;

a first transparent conductive layer 16 disposed on the baseplate, the first transparent conductive layer 16 including a first region corresponding to the color film layer 12 and a second region corresponding to a region for forming a gate lamination layer;

a buffer layer 20 covering the first transparent conductive layer 16;

an active region 24 disposed on the buffer layer 20, wherein the active region 24 includes a first active region and a second active region, the first active region is disposed above the first region, and the second active region is disposed above the second region;

the gate lamination layer disposed on the second active region;

an interlayer dielectric layer 30 covering the second buffer layer 20, the active region 24, and the gate lamination layer, the interlayer dielectric layer 30 having a plurality of via holes;

a second transparent conductive layer 32 disposed on the interlayer dielectric layer 30, wherein the second transparent conductive layer 32 covers the active region 24, and realizes electrical connections of source and drain regions through the via holes;

a planarization layer 40 covering the interlayer dielectric layer 30 and the second transparent conductive layer 32;

an anode 42 disposed on the planarization layer 40;

a pixel defining layer 44 exposing the anode 42;

a light emitting structure covering the pixel defining layer 44 and the anode 42.

In the present embodiment, a projection of the color film layer 12 on the horizontal plane, a projection of the first region on the horizontal plane, and a projection of the first active region on the horizontal plane overlap. Therefore, the first region of the first transparent conductive layer of the active region, the first active region, the second transparent conductive layer, the anode, and insulating layers between them constitute a plurality of capacitor structures connected in series to increase the capacitance of the OLED panel.

In the present embodiment, the baseplate includes: a substrate 10, a patterned color film layer 12 disposed on the substrate 10, and a first buffer layer 20 covering the substrate 10 and the color film layer 12.

In the present embodiment, the display panel further includes a light shielding metal layer 18 between the first transparent conductive layer 16 and the buffer layer 20, a projection of the light shielding metal layer 18 on the horizontal plane overlaps with a projection of the second active region on the horizontal plane.

In the present embodiment, the display panel further includes a metal layer 34 disposed on the second transparent conductive layer 32, a projection of the metal layer 34 on the horizontal plane overlaps with a projection of the second active region on the horizontal plane. Material forming the metal layer 34 is a light shielding metal.

The light shielding metal layer 18 and the metal layer 34 can block the light emitted by the light emitting structure from entering a light sensor under the display panel. Thereby, the interference of the light of the panel in the sensor can be eliminated.

The present application further provides a method of manufacturing an OLED display panel, and the method will be described in detail below.

First, providing a baseplate including a color film layer 12. The baseplate 10 can be a rigid substrate, such as glass or a flexible substrate such as polyimide-film (PI). The color film layer 12 is composed of a regular arrangement of color films of red, green and blue colors. A projection of the color film layer 12 on the horizontal plane, a projection of the first region on the horizontal plane, and a projection of the first active region on the horizontal plane overlap.

Figure 2:
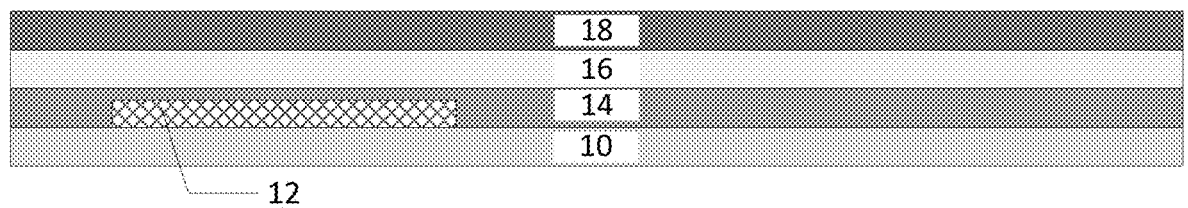
Figure 3:
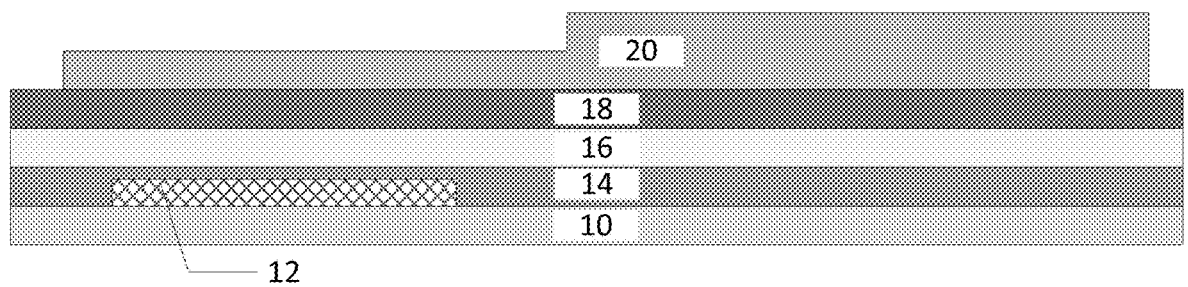

After that, referring to FIG. 2, forming a first transparent conductive layer 16 disposed on the baseplate 10, wherein the first transparent conductive layer 16 includes a first region and a second region, the first region covers the color film layer 12, and the second region is used to form a gate lamination layer.

Figure 4:
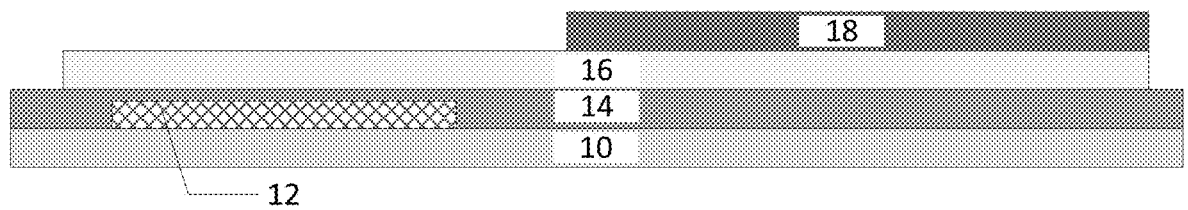

Preferably, after the transparent conductive layer 16 is formed, the method further includes: forming a light shielding metal layer 18 covering the first transparent conductive layer 16; and then patterning the light shielding metal layer 18 to make its projection on the horizontal plane overlaps with a projection of the second active region on the horizontal plane. Thereafter, the light shielding metal layer 18 and the first transparent conductive layer 16 are patterned, as shown in FIG. 4.

Specifically, providing a mask having a first pattern for forming a first transparent conductive layer 16 and a second pattern for forming the light shielding metal layer.

Forming a photoresist covering the light shielding metal layer and the first transparent conductive layer 16, the photoresist having a first thickness. The photoresist is patterned by the mask to form a first photoresist over the first transparent conductive layer 16 and a second photoresist over the light shielding metal layer, the thickness of the first photoresist is less than the thickness of the second photoresist. The light shielding metal layer and the first transparent conductive layer 16 are patterned by using the first photoresist and the second photoresist as a mask.

In the present embodiment, the first pattern and the second pattern of the mask have different transmittances, and the transmittance of the first pattern is smaller than the transmittance of the second pattern. Specifically, it is implemented here by the Half tone mask process. Wherein, the first pattern and the second pattern of the mask have different transmittances, and the transmittance of the first pattern is smaller than the transmittance of the second pattern. In practice, the transmittances of the first pattern and the second pattern are adjusted according to the thickness requirements of the photoresist. The half tone mask technology is a conventional technical means in the art and will not be described here.

Figure 5:
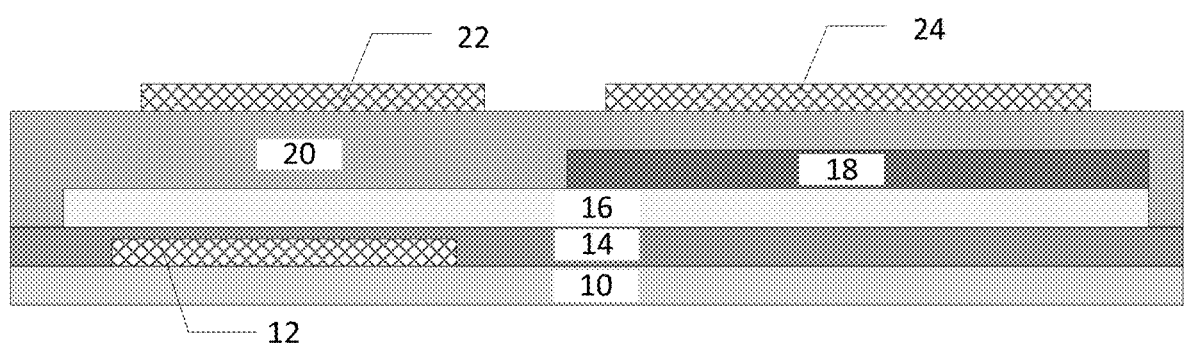

After that, referring to FIG. 5, forming a buffer layer 20 covering the first transparent conductive layer 16, and forming an active region 24 disposed on the buffer layer 20. Wherein the active region 24 includes a first active region and a second active region, the first active region is disposed above the first region, and the second active region is disposed above the second region.

Figure 6:
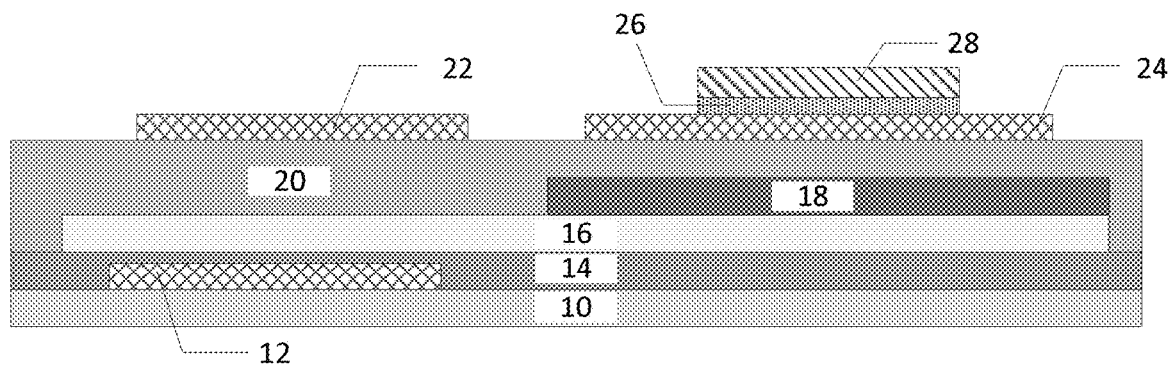

After that, referring to FIG. 6, forming the gate lamination layer over the second active region. The gate lamination layer includes a gate dielectric layer 26 and a metal layer 28 in order from bottom to top.

Figure 7:
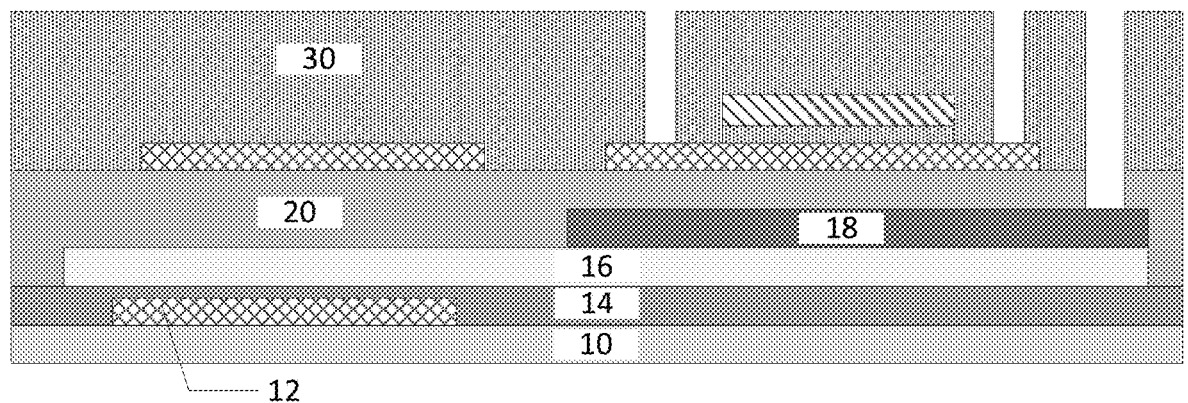

After that, referring to FIG. 7, forming an interlayer dielectric layer 30 covering the second buffer layer 20, the first active region, and the gate lamination layer, the interlayer dielectric layer 30 having a plurality of via holes. Specifically, the via holes includes a first via hole exposing the source, a second via hole exposing a drain, and a third via hole exposing the entire metal layer 18.

Figure 8:
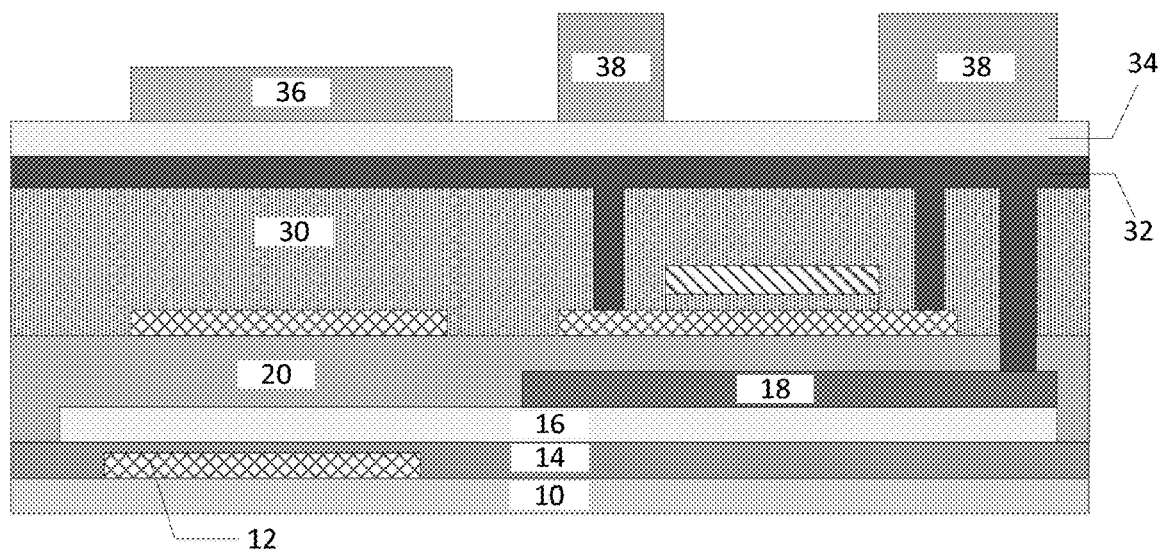

After that, referring to FIG. 8, forming a second transparent conductive layer 32 disposed on the interlayer dielectric layer 30, wherein the second transparent conductive layer 32 is disposed above the first region and the second region, and realizes electrical connection of source and drain regions through the via holes.

Figure 9:
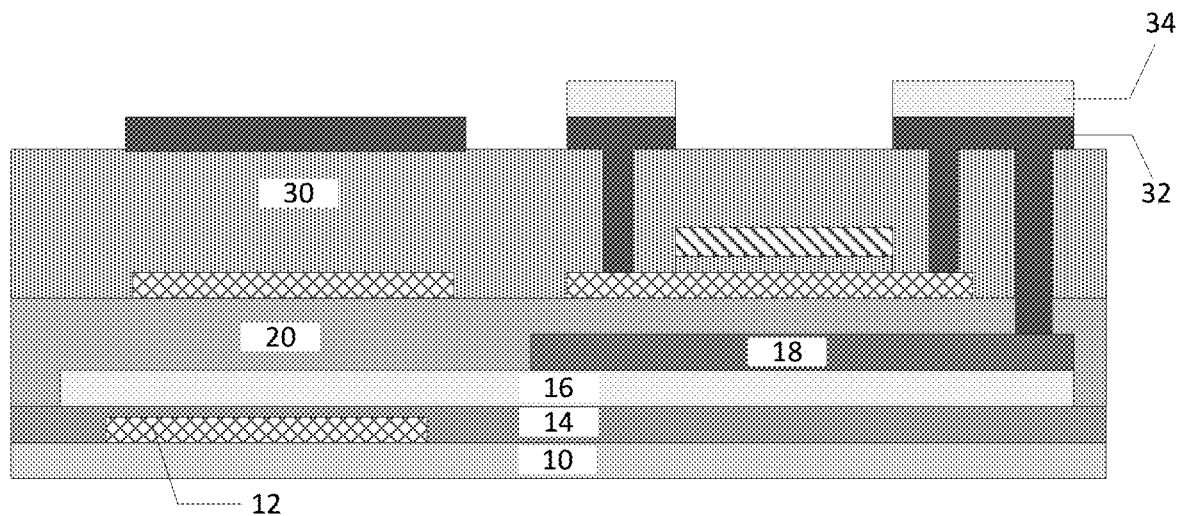

Preferably, referring to FIG. 8, after forming the second transparent conductive layer 32, the method further includes the steps of: forming a metal layer 34 over the second transparent conductive layer 32, a projection of the metal layer 34 on the horizontal plane overlaps with a projection of the second active region on the horizontal plane. Material of the metal layer 34 is a light shielding metal, as shown in FIG. 9.

Thereafter, as shown in FIG. 10, a planarization layer 40 covering the interlayer dielectric layer 30 and the second transparent conductive layer 32, an anode 42 disposed on the planarization layer 40 and a pixel definition layer 44 exposing the anode 42 are formed.

Finally, a light emitting structure covering the pixel defining layer 44 and the anode 42 is formed to form an OLED display panel as shown in FIG. 10.

The OLED display panel provided by the present application has a first transparent conductive layer 16 disposed on the baseplate, a first active region disposed on the first transparent conductive layer 16, and a second transparent conductive layer 32 disposed on the first active region. The first transparent conductive layer 16, the first active region and the second transparent conductive layer 32 are respectively separated by a buffer layer 20 and an interlayer dielectric layer 30, thereby forming a three-layer parallel capacitor structure. The present application can effectively increase the capacitance of the display panel and eliminate the pressure drop phenomenon.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. An organic light emitting diode (OLED) display panel comprising:
    a baseplate comprising a color film layer;
    a first transparent conductive layer disposed on the baseplate, the first transparent conductive layer comprising a first region corresponding to the color film layer and a second region corresponding to a region for forming a gate lamination layer;
    a buffer layer covering the first transparent conductive layer;
    an active region disposed on the buffer layer, wherein the active region comprises a first active region and a second active region, the first active region is disposed above the first region, and the second active region is disposed above the second region;
    the gate lamination layer disposed on the second active region;
    an interlayer dielectric layer covering the buffer layer, the active region, and the gate lamination layer, and the interlayer dielectric layer having a plurality of via holes;
    a second transparent conductive layer disposed on the interlayer dielectric layer, wherein the second transparent conductive layer covers the active region and realizes electrical connection of source and drain regions through the via holes;
    a planarization layer covering the interlayer dielectric layer and the second transparent conductive layer;
    an anode disposed on the planarization layer;
    a pixel defining layer exposing the anode;
    a light emitting structure covering the pixel defining layer and the anode; wherein
    a projection of the color film layer on a horizontal plane, a projection of the first region on the horizontal plane, and a projection of the first active region on the horizontal plane are overlapped.

2. The OLED display panel of claim 1, wherein the baseplate comprises:
    a substrate;
    a patterned color film layer disposed on the substrate; and
    a first buffer layer covering the substrate and the color film layer.

3. The OLED display panel according to claim 1, wherein the display panel further comprises a light shielding metal layer between the first transparent conductive layer and the buffer layer, and a projection of the light shielding metal layer on the horizontal plane overlaps a projection of the second active region on the horizontal plane.

4. The OLED display panel according to claim 1, wherein the display panel further comprises a metal layer disposed on the second transparent conductive layer, and a projection of the metal layer on the horizontal plane overlaps a projection of the second active region on the horizontal plane.

5. The OLED display panel according to claim 4, wherein a material of the metal layer is a light shielding metal.

6. An organic light emitting diode (OLED) display panel comprising:
    a baseplate comprising a color film layer;
    a first transparent conductive layer disposed on the baseplate, the first transparent conductive layer comprising a first region corresponding to the color film layer and a second region corresponding to a region for forming a gate lamination layer;
    a buffer layer covering the first transparent conductive layer;
    an active region disposed on the buffer layer, wherein the active region comprises a first active region and a second active region, the first active region is disposed above the first region, and the second active region is disposed above the second region;
    the gate lamination layer disposed on the second active region;

an interlayer dielectric layer covering the buffer layer, the active region, and the gate lamination layer, and the interlayer dielectric layer having a plurality of via holes;

a second transparent conductive layer disposed on the interlayer dielectric layer, wherein the second transparent conductive layer covers the active region and realizes electrical connection of source and drain regions through the via holes;

a planarization layer covering the interlayer dielectric layer and the second transparent conductive layer;

an anode disposed on the planarization layer;

a pixel defining layer exposing the anode; and a light emitting structure covering the pixel defining layer and the anode.

7. The OLED display panel of claim 6, wherein a projection of the color film layer on a horizontal plane, a projection of the first region on the horizontal plane, and a projection of the first active region on the horizontal plane are overlapped.

8. The OLED display panel of claim 6, wherein the baseplate comprises:

a substrate;

a patterned color film layer disposed on the substrate; and a first buffer layer covering the substrate and the color film layer.

9. The OLED display panel according to claim 6, wherein the display panel further comprises a light shielding metal layer between the first transparent conductive layer and the buffer layer, and a projection of the light shielding metal layer on a horizontal plane overlaps a projection of the second active region on the horizontal plane.

10. The OLED display panel according to claim 6, wherein the display panel further comprises a metal layer disposed on the second transparent conductive layer, and a projection of the metal layer on a horizontal plane overlaps a projection of the second active region on the horizontal plane.

11. The OLED display panel according to claim 10, wherein a material of the metal layer is a light shielding metal.

* * * * *